(12) United States Patent
Saito et al.

(10) Patent No.: US 11,094,681 B2
(45) Date of Patent: Aug. 17, 2021

(54) PHOTOCOUPLER AND PACKAGING MEMBER THEREOF

(71) Applicants: Kabushiki Kaisha Toshiba, Tokyo (JP); Toshiba Electronic Devices & Storage Corporation, Tokyo (JP)

(72) Inventors: Keita Saito, Buzen Fukuoka (JP); Naoya Takai, Yukuhashi Fukuoka (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/562,886

(22) Filed: Sep. 6, 2019

(65) Prior Publication Data

US 2020/0194411 A1   Jun. 18, 2020

(30) Foreign Application Priority Data

Dec. 13, 2018   (JP) .............................. JP2018-233611

(51) Int. Cl.
| | |
|---|---|
| *H01L 31/00* | (2006.01) |
| *H01L 25/16* | (2006.01) |
| *H01L 31/02* | (2006.01) |
| *H01L 31/0203* | (2014.01) |
| *H01L 31/167* | (2006.01) |

(52) U.S. Cl.
CPC ........ *H01L 25/167* (2013.01); *H01L 31/0203* (2013.01); *H01L 31/02005* (2013.01); *H01L 31/167* (2013.01)

(58) Field of Classification Search
None
See application file for complete search history.

(56) References Cited

U.S. PATENT DOCUMENTS

| | | | |
|---|---|---|---|
| 9,099,602 B2 | 8/2015 | Noguchi et al. | |
| 2017/0069610 A1 | 3/2017 | Takai | |

FOREIGN PATENT DOCUMENTS

| | | |
|---|---|---|
| JP | H02-183577 A | 7/1990 |
| JP | 2015-50281 A | 3/2015 |
| JP | 2017-50510 A | 3/2017 |
| JP | 6216418 B2 | 10/2017 |

*Primary Examiner* — Reema Patel
(74) *Attorney, Agent, or Firm* — White & Case LLP (57) ABSTRACT

A photocoupler of an embodiment includes a packaging member, a first and a second MOSFET, a semiconductor light receiving element, a semiconductor light emitting element, a first wiring part, and a sealing resin layer. The input terminal includes a first and a second lead. The output terminal includes a third and a fourth lead. The first conductive region includes a signal input part and a bend part. The fourth conductive region includes a signal input part and a bend part. The semiconductor light receiving element is joined to the first and second MOSFETs astride a gap part. The semiconductor light emitting element is joined onto a light receiving region. The first wiring part connects the source electrode of the first MOSFET and the source electrode of the second MOSFET.

13 Claims, 7 Drawing Sheets

PHOTOCOUPLER AND PACKAGING MEMBER THEREOF

CROSS-REFERENCE TO RELATED APPLICATIONS

This application is based upon and claims the benefit of priority from Japanese Patent Application No. 2018-233611, filed on Dec. 13, 2018; the entire contents of which are incorporated herein by reference.

FIELD

Embodiments described herein relate generally to a photocoupler and a package member thereof.

BACKGROUND

Direct coupling of different power supply lines in one electronic device may cause malfunctions.

Malfunctions can be suppressed by using a photocoupler in which the input and the output are insulated from each other. For instance, numerous photocouplers are used for AC load control in e.g. an inverter air conditioner. Numerous photorelays are used for signal switching of semiconductor automated test equipment.

Large-current output is increasingly required in these applications.

DETAILED DESCRIPTION

In general, a photocoupler of an embodiment includes a packaging member, a first MOSFET, a second MOSFET, a semiconductor light receiving element, a semiconductor light emitting element, a first wiring part, a second wiring part, a third wiring part, and a sealing resin layer. The packaging member includes an insulating substrate, an input terminal, an output terminal, a first die pad part, a second die pad part, a first via electrode, and a second via electrode. The insulating substrate has an upper surface, a first side surface, a second side surface on opposite side from the first side surface, and a lower surface. The input terminal includes a first lead and a second lead and is provided on the first side surface side of the insulating substrate. The first lead includes a first conductive region on the upper surface of the insulating substrate, a second conductive region provided on a sidewall of a notch part provided in the first side surface, and a third region on the lower surface. The second lead includes a fourth conductive region on the upper surface of the insulating substrate, a fifth conductive region on the first side surface, and a sixth conductive region on the lower surface. The output terminal includes a third lead and a fourth lead and is provided on the second side surface side of the insulating substrate. The third lead includes a seventh conductive region on the upper surface of the insulating substrate, an eighth conductive region provided on a notch part of the second side surface, and a ninth conductive region on the lower surface. The fourth lead includes a tenth conductive region on the upper surface of the insulating substrate, an eleventh conductive region on the second side surface, and a twelfth conductive region on the lower surface. The first die pad part is provided on the upper surface of the insulating substrate between the first lead and the third lead. The second die pad part is provided on the upper surface of the insulating substrate between the second lead and the fourth lead. The first via electrode is provided in a first through hole provided in the insulating substrate and connects the first die pad part and the third lead. The second via electrode is provided in a second through hole provided in the insulating substrate and connects the second die pad part and the fourth lead. The first conductive region of the first lead includes a signal input part with an end part included in a plane including the first side surface, and a bend part extending along the first side surface toward the fourth conductive region. The fourth conductive region of the second lead includes a signal input part with an end part included in the plane including the first side surface, and a bend part extending along the first side surface toward the first conductive region. The first MOSFET is provided on the first die pad part and has a first side surface parallel to one outer edge of the first die pad part. The second MOSFET is provided on the second die pad part and has a first side surface parallel to one outer edge of the second die pad part. The semiconductor light receiving element is joined to the first lead side of a surface of the first MOSFET and the second lead side of a surface of the second MOSFET astride a gap part between the first MOSFET and the second MOSFET. One electrode of the semiconductor light receiving element is connected to each gate electrode of the first and second MOSFETs. Another electrode of the semiconductor light receiving element is connected to each source electrode of the first and second MOSFETs. The semiconductor light emitting element is joined onto a light receiving region of a surface of the semiconductor light receiving element. The first wiring part connects the source electrode of the first MOSFET provided on the third lead side and the source electrode of the second MOSFET provided on the surface of the fourth lead side astride the gap part. The second wiring part connects a tip part of the bend part of the first lead and one electrode of the semiconductor light emitting element. The third wiring part connects a tip part of the bend part of the second lead and another electrode of the semiconductor light emitting element. The sealing resin layer is provided on the surface of the insulating substrate, the input terminal, the output terminal, the first die pad part, the second die pad part, the semiconductor light receiving element, and the semiconductor light emitting element.

Embodiments of the invention will now be described with reference to the drawings.

Figure 1:
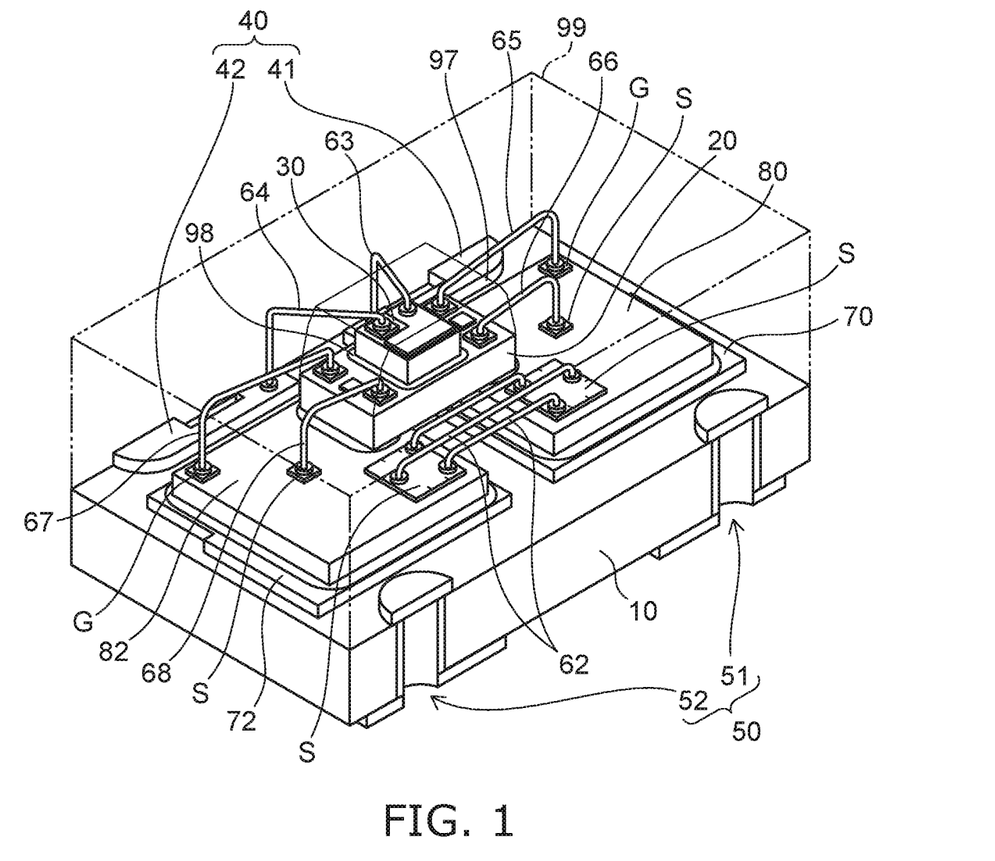
FIG. 1 is a schematic perspective view of a photocoupler according to a first embodiment.

FIG. 1 is a schematic perspective view of a photocoupler according to a first embodiment.

The photocoupler includes a packaging member, a first MOSFET 80, a second MOSFET 82, a semiconductor light receiving element 20, a semiconductor light emitting element 30, a first wiring part 62, a second wiring part 63, a third wiring part 64, and a sealing resin layer 99. The sealing resin layer 99 is shown by a dashed line as before molding.

The first MOSFET 80 is provided on a first die pad part 70 of the packaging member. The second MOSFET 82 is provided on a second die pad part 72 of the packaging member. The two MOSFETS 80, 82 are opposed to each other with an equal spacing. When the MOSFET is of the vertical type, the back surface of the chip constitutes a drain region and can be connected to an output terminal 50 including a third lead 51 and a fourth lead 52 through the die pad part. This can provide a photocoupler having a simple structure.

The semiconductor light receiving element 20 is joined to each of part of the surface of the first MOSFET 80 and part of the surface of the second MOSFET 82 astride a gap part between the first MOSFET 80 and the second MOSFET 82. One electrode of the semiconductor light receiving element 20 is connected to each gate electrode G of the first and second MOSFETs 80, 82. The other electrode of the semiconductor light receiving element 20 is connected to each source electrode S of the first and second MOSFETs 80, 82.

The semiconductor light emitting element 30 emits infrared light. The semiconductor light emitting element 30 is joined onto a light receiving region (generating photovoltaic power by a photodiode array) of the surface of the semiconductor light receiving element 20. That is, this embodiment has a COC (chip on chip) structure in which the MOSFET 80, 82, the semiconductor light receiving element 20, and the semiconductor light emitting element 30 are stacked in three stages. A bonding layer 98 being translucent and insulative may be provided between the semiconductor light receiving element 20 and the semiconductor light emitting element 30. The sealing resin layer (shown by the dashed line) 99 is provided on the surface of the packaging member, an encapsulation resin layer 97, the bonding layer 98, the semiconductor light receiving element 20, and the semiconductor light emitting element 30.

The photocoupler according to the first embodiment enables large-current output by providing the two MOSFETs with a large area. In this case, the increase of chip size results in increasing the size of the packaging member (which constitutes a package). However, reliability is ensured even in high-temperature and high-humidity environments.

Figure 2A:
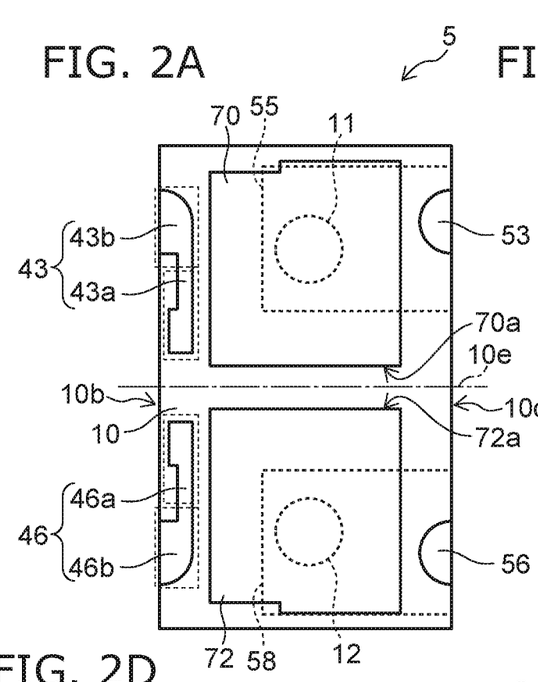
FIG. 2A is a schematic plan view of the packaging member.
Figure 2B:
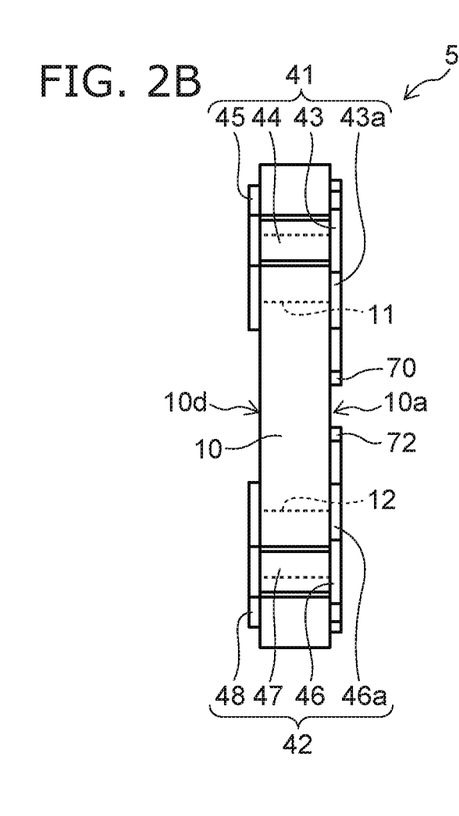
FIG. 2B is a schematic left side view thereof.
Figure 2C:
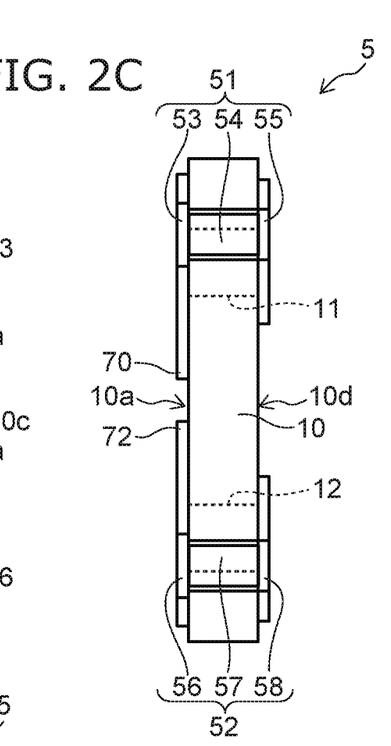
FIG. 2C is a schematic right side view thereof.
Figure 2D:
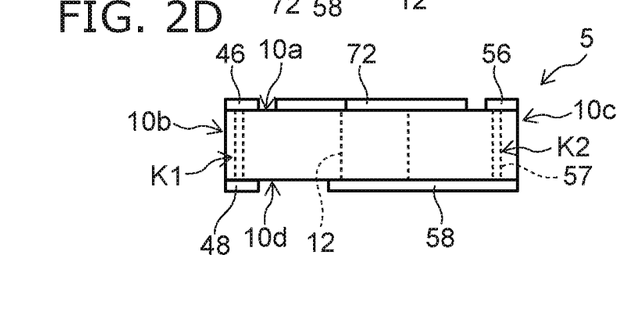
FIG. 2D is a schematic front view thereof.

FIG. 2A is a schematic plan view of the packaging member. FIG. 2B is a schematic left side view thereof. FIG. 2C is a schematic right side view thereof. FIG. 2D is a schematic front view thereof.

The packaging member 5 includes an insulating substrate 10, an input terminal 40 including a first lead 41 and a second lead 42, an output terminal 50 including a third lead 51 and a fourth lead 52, a first die pad part 70, and a second die pad part 72.

The insulating substrate 10 has an upper surface 10*a*, a first side surface 10*b*, a second side surface 10*c* on the opposite side from the first side surface 10*b*, and a lower surface 10*d*. The first lead 41 and the second lead 42 are provided on the first side surface 10*b* side of the insulating substrate 10. The first lead 41 includes a first conductive region 43 on the upper surface 10*a* of the insulating substrate 10, a second conductive region 44 provided on a sidewall provided in a notch part K1 provided in the first side surface 10*b*, and a third conductive region 45 on the lower surface 10*d*. The second lead 42 includes a fourth conductive region 46 on the upper surface 10*a* of the insulating substrate 10, a fifth conductive region 47 provided on a sidewall provided in a notch part K2 of the first side surface 10, and a sixth conductive region 48 on the lower surface 10*d*. The insulating substrate 10 can be a base material made of e.g. glass epoxy.

The third lead 51 and the fourth lead 52 are provided on the second side surface 10*c* side of the insulating substrate 10. The third lead 51 includes a seventh conductive region 53 on the upper surface 10*a* of the insulating substrate 10, an eighth conductive region 54 on a sidewall of the notch part K2 provided in the second side surface 10*c*, and a ninth conductive region 55 on the lower surface 10*d*. The fourth lead 52 includes a tenth conductive region 56 on the upper surface 10*a* of the insulating substrate 10, an eleventh conductive region 57 on a sidewall of the notch part K2 provided in the second side surface 10*c*, and a twelfth conductive region 58 on the lower surface 10*d*.

The first die pad part 70 is provided on the upper surface 10*a* of the insulating substrate 10 between the first lead 41 and the third lead 51. The second die pad part 72 is provided on the upper surface 10*a* of the insulating substrate 10 between the second lead 42 and the fourth lead 52. The first conductive region 43 of the first lead 41 includes a signal input part 43*b* with an end part included in a plane including the first side surface 10*b*, and a bend part 43*a* extending along the first side surface 10*b* toward the fourth conductive region 46. The bend part 43*a* has a structure having a smaller area than the signal input part 43*b*. The tip part of the bend part 43*a* constitutes three sides of a quadrangle. The fourth conductive region 46 of the second lead 42 includes a signal input part 46*b* with an end part included in the plane including the first side surface 10*b*, and a bend part 46*a* extending along the first side surface 10*b* toward the first conductive region 43. The bend part 46*a* has a structure having a smaller area than the signal input part 46*b*. The tip part of the bend part 46*a* constitutes two adjacent sides or three sides of a quadrangle.

The first die pad part 70 and the second die pad part 72 have two outer edges 70*a*, 72*a* being parallel to a first straight line 10*e* orthogonal to each of the first side surface 10*b* and the second side surface 10*c* and opposed to each other with an equal spacing.

In the conductive region of the packaging member 5, Ni can be stacked on a Cu base material, and e.g. Au, Ag, or Pd can be provided as a protective layer on the surface of Ni.

The insulating substrate 10 is provided with a through hole. For instance, a first via electrode 11 can be provided in a first through hole to connect the first die pad part 70 and the ninth conductive region 55 of the third lead 51. A second via electrode 12 can be provided in a second through hole to connect the second die pad part 72 and the twelfth conductive region 58 of the fourth lead 52.

Next, the photocoupler according to the first embodiment is described in more detail.

Figure 3A:
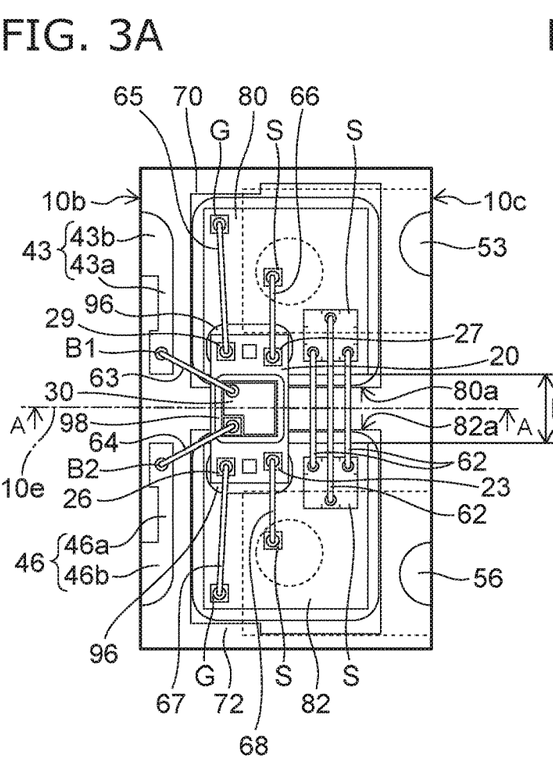
FIG. 3A is a schematic plan view of the photocoupler according to the first embodiment.
Figure 3B:
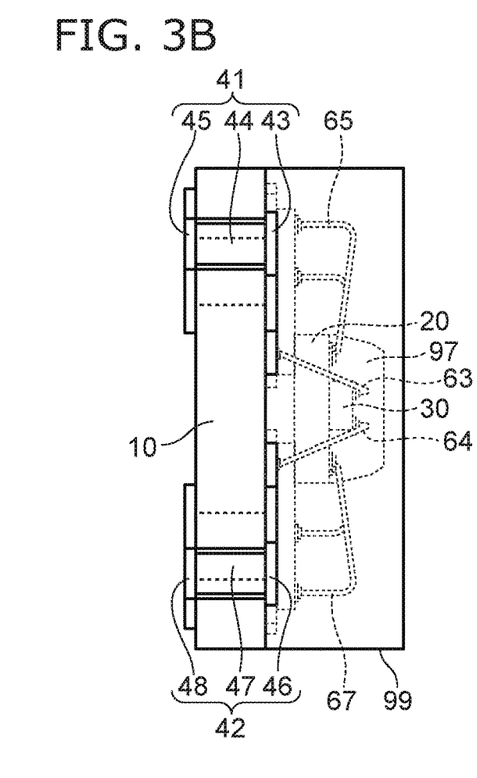
FIG. 3B is a schematic left side view thereof.
Figure 3C:
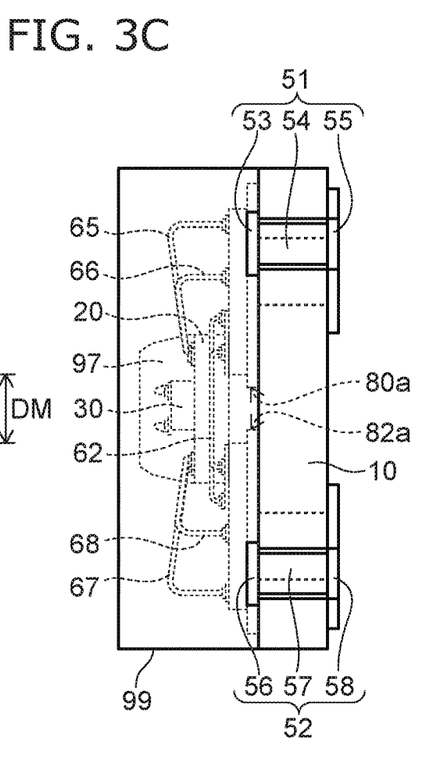
FIG. 3C is a schematic right side view thereof.

FIG. 3A is a schematic plan view of the photocoupler according to the first embodiment. FIG. 3B is a schematic left side view thereof. FIG. 3C is a schematic right side view thereof.

Figure 4:
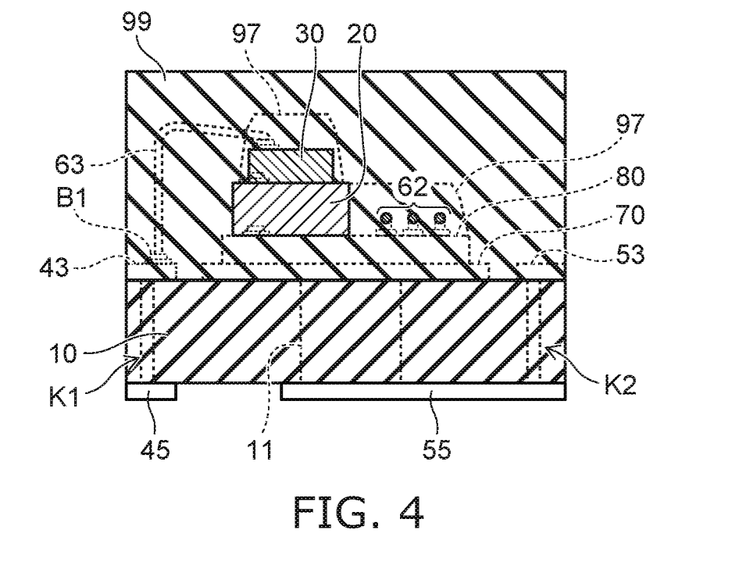
FIG. 4 is a schematic sectional view taken along line A-A of FIG. 3A.

FIG. 4 is a schematic sectional view taken along line A-A of FIG. 3A.

FIG. 3A shows a schematic plan view before molding the sealing resin layer 99. The semiconductor light emitting element 30 is insulated from the operating region of the MOSFET 80, 82. Specifically, an insulating layer 96 may be provided on the bonding region on the MOSFET side. Alternatively, an insulating layer 98 may be provided on the bonding region side of the semiconductor light emitting element 30. Alternatively, an insulated conductive shield film 98 may be placed between the semiconductor light emitting element 30 and the MOSFET 80, 82. The conductive shield film reduces radiation noise between the chips. The conductive shield film is shaped like a sheet. The conductive shield film may be configured as a continuous body, discrete islands, a line, or a combination thereof.

The first wiring part 62 constitutes a current path connecting a source electrode S provided on the surface of the first MOSFET 80 and a source electrode S provided on the surface of the second MOSFET 82. The first wiring part 62 can be e.g. a bonding wire. FIGS. 1, 3A to 3C illustrate three bonding wires of the first wiring part 62. However, the invention is not limited thereto (as long as it can pass a large current).

Next, a first variation of the first embodiment is described. The source electrodes S of the two MOSFETs can be connected to each other by a plurality of bonding wires. As shown in FIG. 3A, use of three bonding wires facilitates large-current control. In FIG. 3A, the central bonding wire is made longer than the two adjacent bonding wires.

The second wiring part 63 connects a tip part of the bend part 43a of the first lead 41 and one electrode of the semiconductor light emitting element 30. The third wiring part 64 connects a tip part of the bend part 46a of the second lead 42 and the other electrode of the semiconductor light emitting element 30. The second and third wiring parts 63, 64 can be e.g. bonding wires. Preferably, the length of the bonding wire is made shorter. This can reduce the influence of stress due to the sealing resin layer.

A fourth wiring part 65 connects an electrode 29 of the semiconductor light receiving element 20 and the gate electrode G of the first MOSFET 80. A fifth wiring part 67 connects an electrode 26 of the semiconductor light receiving element 20 and the gate electrode G of the second MOSFET 82. A sixth wiring part 66 connects an electrode 27 of the semiconductor light receiving element 20 and the source electrode S of the first MOSFET. A seventh wiring part 68 connects an electrode 23 of the semiconductor light receiving element 20 and the source electrode S of the second MOSFET.

The sixth wiring part 66 is spaced from the first wiring part 62 and located near the central part of the first MOSFET 80. The seventh wiring part 68 is spaced from the first wiring part 62 and provided near the central part of the second MOSFET 82. These wiring parts are spaced from each other, and one of them is located at the central part. Thus, the current can be passed uniformly in the element. The wirings are provided closely in parallel and are different in length. This can suppress e.g. peeling of the neck part due to resin stress and has the effect of improving reliability. As shown in FIG. 4, the encapsulation resin layer 97 may cover the source region of the MOSFET. Moisture resistance is improved by covering the element with the encapsulation resin layer 97. This can prevent characteristics degradation due to mobile ions in the sealing resin layer 99.

Figure 5:
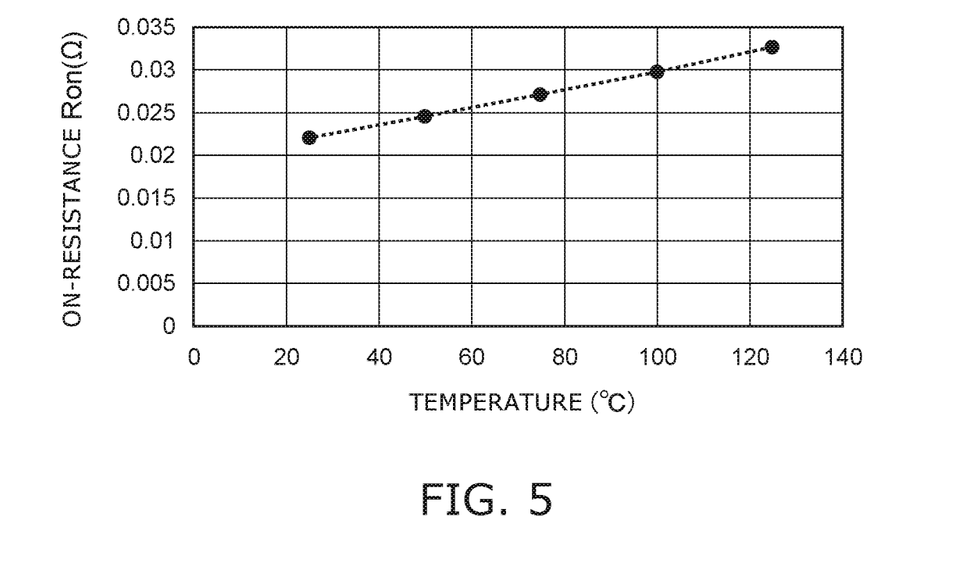
FIG. 5 is a graph showing the temperature dependence of on-resistance in the first variation of the first embodiment.

FIG. 5 is a graph showing the temperature dependence of on-resistance in the first variation of the first embodiment. As shown in FIG. 3, the first variation is configured as a structure in which the first wiring part 62 includes three bonding wires different in length. The vertical axis represents on-resistance Ron ($\Omega$) for a source current of 4 A. The horizontal axis represents temperature (° C.). The on-resistance Ron changed between 0.022$\Omega$ (at 25° C.) and 0.0325$\Omega$ (at 125° C.). In the first variation, among the three bonding wires of the first wiring part 62, the central bonding wire is the longest. The other two bonding wires are each placed parallel to the central bonding wire and are shorter in length. Furthermore, the sixth wiring part 66 connecting the semiconductor light receiving element 20 and the source S is also placed parallel to the seventh wiring part 68 connecting the semiconductor light receiving element 20 and the source S. This lowers the wiring resistance and the on-resistance Ron. Thus, operation at a larger current can be achieved. Furthermore, a plurality of vias are provided in the second embodiment described later. This improves heat dissipation and lowers thermal resistance. Thus, the on-resistance Ron is lowered, and operation at a larger current can be achieved.

The combination of wires including bonding wires different in length suppresses deformation (such as wire flow, neck break, and ball peeling) by the sealing resin layer 99 compared with a single wire. This reduces e.g. variation of off-current Ioff in TCT (temperature cycling test). Thus, reliability is improved.

In FIG. 3A, the position B1 of the ball of the wire in the tip part of the second wiring part 63 connected to the bend part 43a of the first lead 41 is not located inside the projection area in which the inside of the package is viewed from the end part of the signal input part 43b of the first conductive region 43 exposed from the sealing resin layer 99. The position B1 is located at a position bent and extended horizontally along the first side surface 10b. Likewise, the position B2 of the ball of the wire in the tip part of the third wiring part 64 connected to the bend part 46a of the second lead 42 is not located inside the projection area in which the inside of the package is viewed from the end part of the signal input part 46b of the fourth conductive region 46 exposed from the sealing resin layer 99. The position B2 is located at a position bent and extended horizontally along the first side surface 10b. Furthermore, the width of the bend part 43a, 46a is narrowed midway along the lead where the sealing resin layer 99 has lower adhesion strength to the lead and may peel from the lead. However, the sealing resin layer 99 is in good adhesion on both sides of this peeling portion. Thus, the peeling direction is different from the stress direction of the resin layer. This can suppress internal advance of peeling and improve reliability in high-temperature and high-humidity test.

Figure 6:
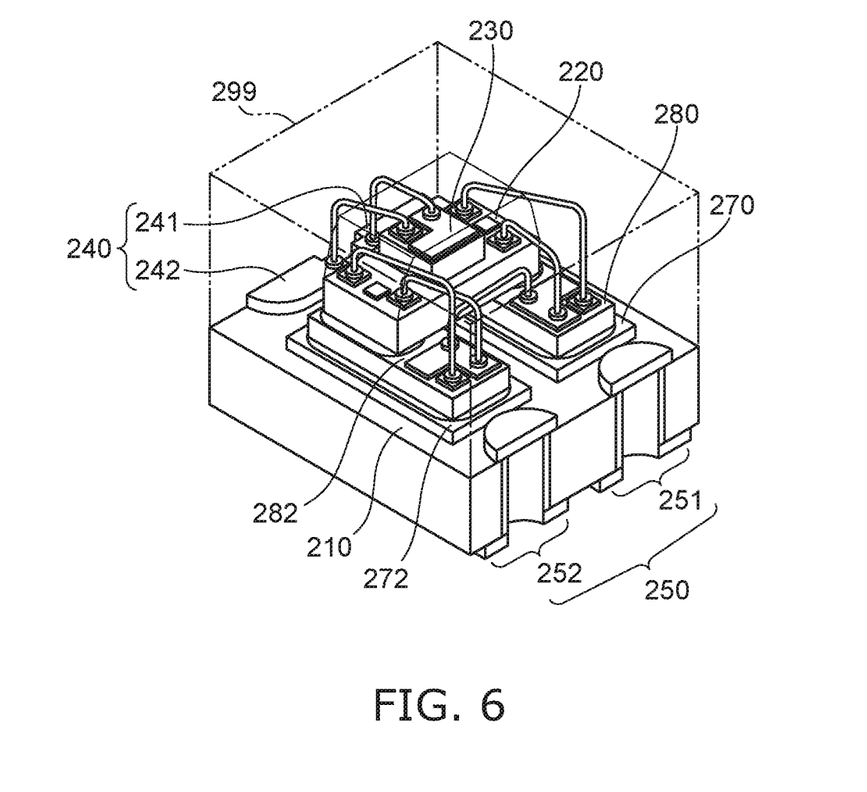
FIG. 6 is a schematic perspective view of a photocoupler according to a comparative example.

FIG. 6 is a schematic perspective view of a photocoupler according to a comparative example.

The photocoupler of the comparative example includes an insulating substrate 210, an input terminal 240 including a first lead 241 and a second lead 242, an output terminal 250 including a third lead 251 and a fourth lead 252, a first MOSFET 280 on a die pad 270, a second MOSFET 282 on a die pad part 272, a semiconductor light receiving element 220 provided astride the two MOSFETs, a semiconductor light emitting element 230 provided on the semiconductor light receiving element 220, and a sealing resin layer 299. The photocoupler has a COC structure in which the MOSFET 280, 282, the semiconductor light receiving element 220, and the semiconductor light emitting element 230 are stacked in three stages. The photocoupler of the comparative example has a size of e.g. 1.75 mm (maximum) and an area of 1.45 mm×2.00 mm (standard). The maximum on-current is e.g. 1 A.

In this respect, in the photocoupler for large-current control, it is necessary to increase the source effective area of the MOSFET. That is, the chip size of the MOSFET is increased (the package size is also increased). For instance, in the comparative example, when the size of the MOSFET is tripled, the size of the photocoupler is also nearly tripled. Thus, after TCT, peeling starts to occur at the interface between the metal of the package end part and the sealing resin layer 299 where adhesion is relatively weak. Accordingly, the peeling portion is likely to spread throughout the package. As a result, external impurities may penetrate into the package, or the advance of peeling may lead to progressive destruction of the wire bonding ball part. Thus, the problem of reliability decrease is likely to occur.

When the package area of the comparative example is simply tripled, the bonding wire length between the chip of the semiconductor light emitting element 230 and the bonding pad of the package is lengthened due to the bonding pad layout. This increases the influence of stress due to the sealing resin layer 299. Thus, e.g. bonding wire flow and bonding wire peeling are more likely to occur. Furthermore, when the conventional package area is simply enlarged threefold, the on-resistance Ron is between 0.025Ω (at 25° C.) and 0.04Ω (at 125° C.), being larger than the first variation.

In contrast, in the first embodiment, even when the chip size of the MOSFET 80, 82 is enlarged approximately threefold for large-current operation, the length of the bonding wire connecting the first lead 41 and the semiconductor light emitting element 30 and the length of the bonding wire connecting the second lead 42 and the semiconductor light emitting element 30 can be made small. This can suppress e.g. bonding wire flow and bonding wire peeling. The position B1, B2 of the ball of the wire of the second and third wiring part 63, 64 is located at a position bent and extended horizontally from the first and second lead 41, 42 exposed to the first side surface 10b. This can suppress progressive destruction of the wire bonding part. That is, reliability can be maintained at a high level even when the package area is increased. The three-stage COC structure can suppress the increase of package size while enabling large-current operation.

When the source current is tripled, it is necessary to increase the current capacity of the wiring part connecting the two sources. In the first embodiment and the first variation thereof, the two source electrodes S are opposed to each other and connected with a short distance. This enables large-current operation. The planar pattern of the two MOSFETs may be made symmetric with respect to the first straight line 10e. This improves the balance of electrical characteristics.

Figure 7A:
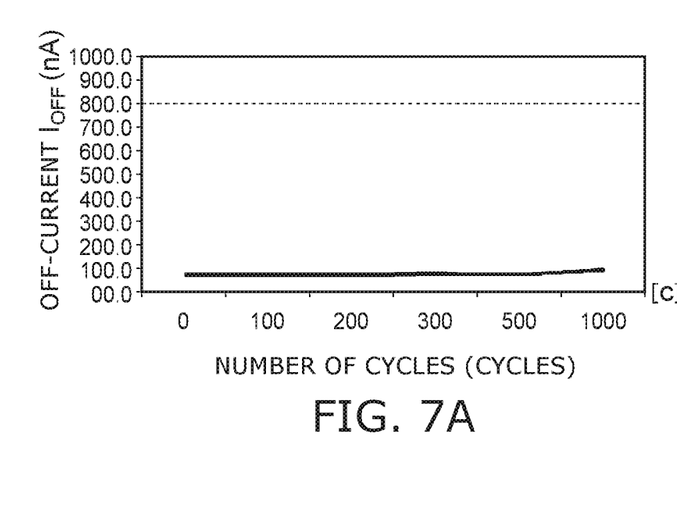
FIG. 7A is a graph showing a result of TCT in the photocoupler of the first embodiment when the 53-56 forward leak current is 20 nA at 31 V.
Figure 7B:
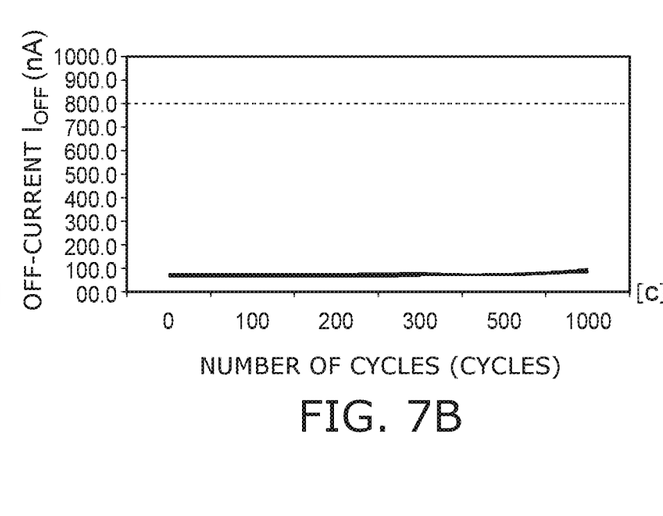
FIG. 7B is a graph showing a result of TCT when the 53-56 reverse leak current is 20 nA at 31 V.

FIG. 7A is a graph showing a result of TCT in the photocoupler of the first embodiment when the 53-56 forward leak current is 20 nA at 31 V. FIG. 7B is a graph showing a result of TCT when the 53-56 reverse leak current is 20 nA at 31 V.

The vertical axis represents off-current ($I_{OFF}$). The horizontal axis represents the number of repetition cycles of temperature change between −65° C. and 150° C. After 1000 cycles, the off-current $I_{OFF}$ is as low as approximately 100 nA. There is no occurrence of e.g. bonding wire open.

Figure 8:
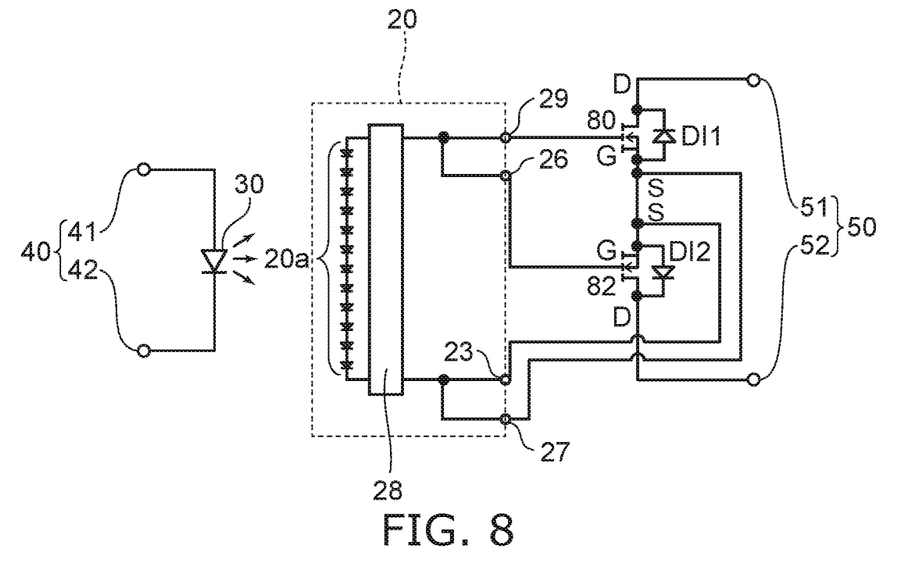
FIG. 8 is an equivalent circuit diagram of the photocoupler according to the first embodiment.

FIG. 8 is an equivalent circuit diagram of the photocoupler according to the first embodiment.

The semiconductor light receiving element 20 can further include a control circuit 28. The control circuit 28 is connected to each of the electrode 26, 29 and the electrode 23, 27 of the photodiode array 20a. When the optical signal is on, the control circuit 28 supplies the current and voltage of the photodiode array 20a to the MOSFET 80, 82. (For instance, the path between the electrode 26, 29 and the electrode 23, 27 is made open.) When the optical signal is off, the control circuit 28 makes a short circuit between the gate G and the source S of the MOSFET 80, 82 to extract stored charge, thereby turning off the MOSFET 80, 82. (For instance, the path between the electrode 26, 29 and the electrode 23, 27 is short-circuited.)

The simplest configuration of the control circuit 28 is to connect a resistor between the electrode 26, 29 and the electrode 23, 27. Such a configuration can supply a voltage to each gate of the MOSFETs 80, 82 in source common connection.

The MOSFETs 80, 82 can be of e.g. the n-channel enhancement type. The MOSFET 80, 82 is connected to the electrode 23, 27 of the photodiode array 20a. Each gate is connected to the electrode 26, 29. Each drain constitutes the output terminal 50.

When the optical signal is on, the MOSFETs 80, 82 are both turned on and connected to an external circuit including the power supply and the load through the output terminal. On the other hand, when the optical signal is off, the MOSFETs 80, 82 are both turned off and disconnected from the external circuit. In source common connection, switching such as disconnection and connection of analog signals and AC signals is facilitated between the third lead 51 and the fourth lead 52.

Normally, p-n diodes DI1, DI2 provided between the drain and the source. When the MOSFETs 80, 82 are on, one of the diodes DI1, DI2 can constitute part of the current path. Thus, two MOSFETs 80, 82 in source common connection enable AC load control.

Next, a second variation of the first embodiment is described.

In FIG. 3A, the distance between the mount beds of the two MOSFETs 80, 82 is denoted by DM. The mount material of the MOSFET chip is e.g. Ag paste. If the distance DM between the mount beds cannot be maintained at a prescribed distance or more, a location of electric field concentration may occur. This causes ion migration near the location and results in the short mode. On the other hand, when the distance DM between the mount beds is made too large, the package size is enlarged. Furthermore, this lowers the mount strength of the semiconductor light receiving element 20 bonded astride the gap part of the two MOSFETs.

In the second variation, the distance DM between the mount beds is set to 0.3 mm or more. In this case, the decrease of withstand voltage was not observed even when a voltage of 400 V is applied up to 500 hours under the high-temperature and high-humidity environment of 85° C. and 85%. That is, the occurrence of the short mode due to migration was suppressed. In contrast, when the distance DM between the mount beds was as small as 0.15 mm, it was difficult to ensure a withstand voltage of 100 V or more, and the short mode due to migration occurred.

Furthermore, the air gap part can be filled with the sealing resin layer 99. Thus, the semiconductor light receiving element 20 is not lifted up, and is surrounded with the sealing resin layer 99. This improves adhesion strength. In this case, more preferably, the semiconductor light emitting element 30 overlaps part of each of the MOSFETs 80, 82. In the case of the semiconductor light emitting element 30 not overlapping part of the MOSFET in plan view, the junction strength between the semiconductor light emitting element 30 and the semiconductor light receiving element 20 was decreased. Furthermore, the junction strength between the semiconductor light receiving element 20 and the MOSFET was also decreased. In addition, the decrease of positional accuracy was found to result in the decrease of junction area and light intensity. This variation improves adhesiveness and suppresses peeling.

Next, a photocoupler according to a second embodiment is described.

The photocoupler of the second embodiment is based on a variation of the packaging member 5 shown in FIGS. 2A, 2B, 2C and 2D.

Figure 9:
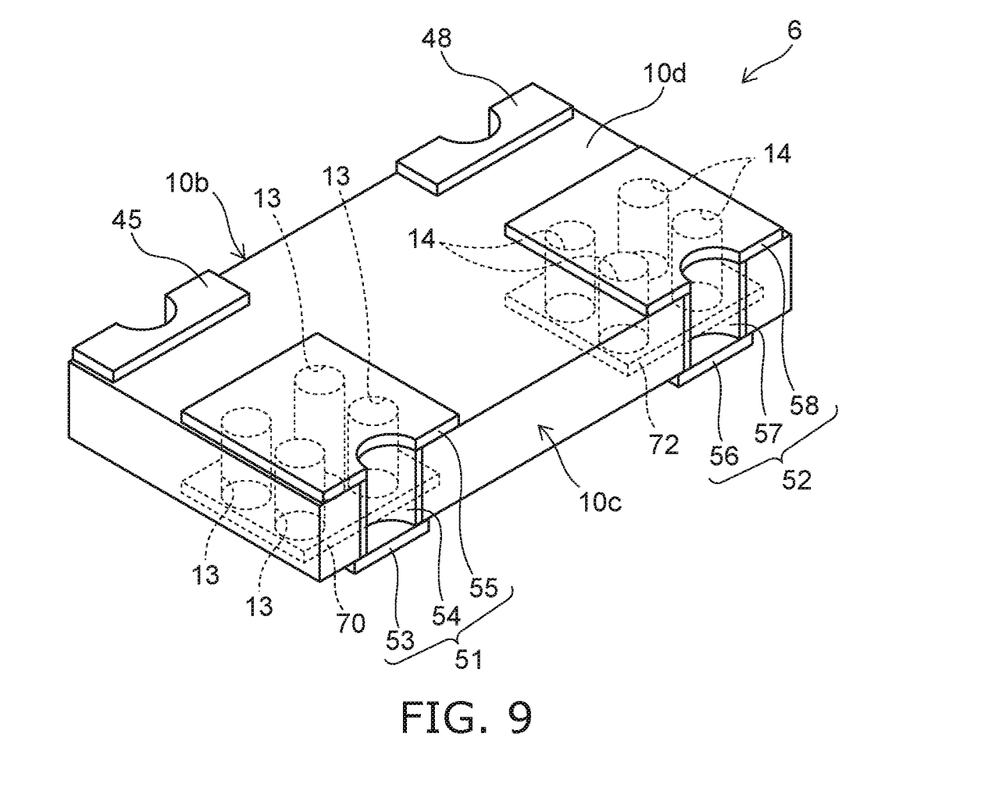
FIG. 9 is a schematic perspective view of the lower surface of a packaging member according to the variation.

FIG. 9 is a schematic perspective view of the lower surface of a packaging member according to the variation.

The packaging member 6 includes a die pad part larger than the projection area of the MOSFET in plan view. The packaging member 6 includes a plurality of (in the embodiment, four) via electrodes 13, 14 spaced from each other inside an area smaller than the projection area of the MOSFET or the pad part joined to the die pad part in plan view. The plurality of via electrodes 13, 14 are placed widely with an equal spacing directly below the MOSFET in plan view. This provides a structure maximizing the effect of heat dissipation.

Thus, the heat dissipation is averaged in accordance with the size of the area of the sealing resin layer 99 in contact with the upper part of the MOSFET. This can facilitate downward heat dissipation. For instance, four via electrodes 13, 14 were provided for a MOSFET of 1 mm□. Then, electrical characteristics and package strength were better than in the structure including one via electrode having the same area as the sum of the areas of the four via electrodes. The electrode pattern of the conductive regions 55, 58 on the lower surface of the third lead 51 and the fourth lead 52 connected to the via electrodes 13, 14 is configured to be at least 20% of the chip area of the MOSFET. The electrode pattern has symmetry divided at the center in accordance with the arrangement of the MOSFET chips. The electrode pattern is configured so that the area of the portion not in contact with the peripheral part of the package in four directions is larger than the area of the portion in contact with the peripheral part of the package. This suppresses the Manhattan phenomenon and the problem of e.g. biasing and rotation of the package at the time of packaging.

Next, a photocoupler according to a third embodiment is described.

The photocoupler further includes an encapsulation resin layer 97 covering the upper surface of the semiconductor light emitting element 30 and the upper side surface of the semiconductor light receiving element 20. The encapsulation resin layer 97 contains gel-like silicone resin or rubber-like silicone resin. The gel-like silicone resin has a hardness between 10 and 24 in JIS K 6253 type A. The rubber-like silicone resin has a hardness of 30 or more in JIS K 6253 type A. The encapsulation resin layer 97 reduces tensile stress from the sealing resin layer 99. The encapsulation resin layer 97 may cover the upper surface of the first and second MOSFETs 80, 82, and further cover the junction portion on the MOSFET side of each wiring part. The sealing resin layer 99 is provided on the encapsulation resin layer 97. The sealing resin layer 99 contains epoxy resin or silicone resin.

The strength is increased when the thickness of the photocoupler including the sealing resin layer 99 is increased. However, when the sealing resin layer 99 is thickened, it lifts up the semiconductor light emitting element 30 and produces a gap with the semiconductor light receiving element. This increases the optical coupling distance and causes the problem of the decrease of optical coupling characteristics. On the other hand, when the thickness is decreased, the sealing strength of the resin layer is decreased by downsizing. According to TCT conducted by the inventors at −60-150° C., a preferable thickness of the photocoupler was found to be approximately 1.3 mm in view of tradeoff between thickness and strength.

When the total amount of mobile ions contained in the resin is minimized, the ion activity is suppressed under high temperature and high humidity. This can relax the characteristic influence on the chip. According to the third embodiment, the sealing resin layer 99 can suppress degradation of withstand voltage under the influence of ions.

The first to third embodiments and the variations associated therewith provide a photocoupler and a packaging member thereof capable of large-current output. This photocoupler including a photorelay can be widely used in a signal transmission device in which the input and the output are insulated from each other.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A packaging member comprising:
an insulating substrate having an upper surface, a first side surface, a second side surface on opposite side of the first side surface, and a lower surface;
an input terminal including a first lead and a second lead and provided on the first side surface side of the insulating substrate, the first lead including a first conductive region on the upper surface of the insulating substrate, a second conductive region provided on a sidewall of a notch part provided in the first side surface, and a third region on the lower surface, and the second lead including a fourth conductive region on the upper surface of the insulating substrate, a fifth conductive region on the first side surface, and a sixth conductive region on the lower surface;
an output terminal including a third lead and a fourth lead and provided on the second side surface side of the insulating substrate, the third lead including a seventh conductive region on the upper surface of the insulating substrate, an eighth conductive region provided on a sidewall of a notch part of the second side surface, and a ninth conductive region on the lower surface, and the fourth lead including a tenth conductive region on the upper surface of the insulating substrate, an eleventh conductive region on the second side surface, and a twelfth conductive region on the lower surface;
a first die pad part provided on the upper surface of the insulating substrate between the first lead and the third lead;
a second die pad part provided on the upper surface of the insulating substrate between the second lead and the fourth lead;
a first via electrode provided in a first through hole provided in the insulating substrate and connecting the first die pad part and the third lead; and a second via electrode provided in a second through hole provided in the insulating substrate and connecting the second die pad part and the fourth lead, the first conductive region of the first lead including a signal input part with an end part included in a plane including the first side surface, and a bend part extending along the first side surface toward the fourth conductive region, and the fourth conductive region of the second lead including a signal input part with an end part included in the plane including the first side surface, and a bend part extending along the first side surface toward the first conductive region.

2. The member according to claim 1, wherein
the first via electrode includes a plurality of regions, and the second via electrode includes a plurality of regions.

3. A photocoupler comprising:
the packaging member according to claim 1;
a first MOSFET provided on the first die pad part and having a first side surface parallel to one outer edge of the first die pad part;
a second MOSFET provided on the second die pad part and having a first side surface parallel to one outer edge of the second die pad part;
a semiconductor light receiving element joined to the first lead side of a surface of the first MOSFET and the second lead side of a surface of the second MOSFET astride a gap part between the first MOSFET and the second MOSFET, one electrode of the semiconductor light receiving element being connected to each gate electrode of the first and second MOSFETs, and another electrode of the semiconductor light receiving element being connected to each source electrode of the first and second MOSFETs;
a semiconductor light emitting element joined onto a light receiving region of a surface of the semiconductor light receiving element;
a first wiring part connecting the source electrode of the first MOSFET provided on the third lead side and the source electrode of the second MOSFET provided on the surface of the fourth lead side astride the gap part;
a second wiring part connecting a tip part of the bend part of the first lead and one electrode of the semiconductor light emitting element;
a third wiring part connecting a tip part of the bend part of the second lead and another electrode of the semiconductor light emitting element; and
a sealing resin layer provided on the surface of the insulating substrate, the input terminal, the output terminal, the first die pad part, the second die pad part, the semiconductor light receiving element, and the semiconductor light emitting element.

4. The photocoupler according to claim 3, further comprising:
a fourth wiring part connecting the one electrode of the semiconductor light receiving element and the gate electrode of the first MOSFET;
a fifth wiring part connecting the one electrode of the semiconductor light receiving element and the gate electrode of the second MOSFET;
a sixth wiring part connecting the other electrode of the semiconductor light receiving element and the source electrode of the first MOSFET; and
a seventh wiring part connecting the other electrode of the semiconductor light receiving element and the source electrode of the second MOSFET.

5. The photocoupler according to claim 3, wherein each of the first MOSFET and the second MOSFET is a vertical MOSFET.

6. The photocoupler according to claim 4, wherein each of the first MOSFET and the second MOSFET is a vertical MOSFET.

7. The photocoupler according to claim 3, wherein the first wiring part includes a plurality of bonding wires different in length.

8. The photocoupler according to claim 3, further comprising:
an encapsulation resin layer covering the semiconductor light emitting element and the semiconductor light receiving element,
wherein the sealing resin layer is provided on the encapsulation resin layer.

9. The photocoupler according to claim 8, wherein the encapsulation resin layer further covers the first and second MOSFETs.

10. The photocoupler according to claim 8, wherein the encapsulation resin layer contains silicone resin having a hardness smaller than a hardness of the sealing resin layer.

11. The photocoupler according to claim 9, wherein the encapsulation resin layer contains silicone resin having a hardness smaller than a hardness of the sealing resin layer.

12. The photocoupler according to claim 3, wherein
the first via electrode includes a plurality of regions, and the second via electrode includes a plurality of regions.

13. A packaging member comprising:
an insulating substrate having an upper surface, a first side surface, a second side surface on opposite side of the first side surface, and a lower surface; and
an input terminal including a first lead and a second lead and provided on the first side surface side of the insulating substrate, the first lead including a first conductive region on the upper surface of the insulating substrate, a second conductive region provided on a sidewall of a notch part provided in the first side surface, and a third region on the lower surface, and the second lead including a fourth conductive region on the upper surface of the insulating substrate, a fifth conductive region on the first side surface, and a sixth conductive region on the lower surface,
the first conductive region of the first lead including a signal input part with an end part included in a plane including the first side surface, and a bend part extending along the first side surface toward the fourth conductive region, and
the fourth conductive region of the second lead including a signal input part with an end part included in the plane including the first side surface, and a bend part extending along the first side surface toward the first conductive region.

* * * * *